(12) United States Patent
Lee et al.

(10) Patent No.: US 7,139,449 B2
(45) Date of Patent: Nov. 21, 2006

(54) OPTICAL TRANSMITTER MODULE

(75) Inventors: Shin-Ge Lee, Hsinchu (TW);
Chun-Hsing Lee, Hsinchu (TW);
Chih-Li Chen, Hsinchu (TW);
Chiung-Hung Wang, Hsinchu (TW);
Shun-Tien Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 41 days.

(21) Appl. No.: 10/838,258

(22) Filed: May 5, 2004

(65) Prior Publication Data
US 2005/0141825 A1  Jun. 30, 2005

(30) Foreign Application Priority Data
Dec. 26, 2003  (TW) .............................. 92137233 A

(51) Int. Cl.
*G02B 6/12* (2006.01)
*G02B 6/36* (2006.01)
*H04B 10/00* (2006.01)

(52) U.S. Cl. ........................ 385/14; 385/92; 398/140
(58) Field of Classification Search .................. 385/14, 385/92, 88–91, 129–131; 398/140, 141, 398/164, 156
See application file for complete search history.

(56) References Cited

U.S. PATENT DOCUMENTS

| | | | | |
|---|---|---|---|---|
| 6,920,161 B1* | 7/2005 | Riaziat et al. | ................ | 372/36 |
| 6,951,426 B1* | 10/2005 | Weber | ........................ | 385/88 |
| 2002/0141142 A1 | 10/2002 | Rookes | | |
| 2004/0126066 A1* | 7/2004 | Keh et al. | ...................... | 385/92 |
| 2004/0179793 A1* | 9/2004 | McColloch et al. | .......... | 385/92 |
| 2004/0198079 A1* | 10/2004 | Aronson et al. | ........... | 439/76.1 |
| 2004/0234214 A1* | 11/2004 | Zheng | ........................ | 385/94 |

FOREIGN PATENT DOCUMENTS

EP    1267459 A1    12/2002

* cited by examiner

*Primary Examiner*—Brian Healy
*Assistant Examiner*—Michael P. Mooney
(74) *Attorney, Agent, or Firm*—Birch, Stewart, Kolasch & Birch, LLP

(57) ABSTRACT

An optical transmitter module includes light-emitting devices with coaxial type packaging. Coplanar anode and cathode electrodes of one light-emitting device are mounted on a substrate so that heat generated from the light-emitting device can be effectively dissipated through the substrate. Furthermore, the direct electric connection between the light-emitting device and the substrate eliminates the requirement of wire boding for electric connection, increasing the performance of the optical transmitter module in high speed signal operation.

16 Claims, 2 Drawing Sheets

OPTICAL TRANSMITTER MODULE

This Non-provisional application claims priority under 35 U.S.C. § 119(a) on patent application Ser. No(s). 092137233 filed in Taiwan on Dec. 26, 2003, the entire contents of which are hereby incorporated by reference.

BACKGROUND OF THE INVENTION

1. Field of Invention

The present invention relates to an optical transmitter module. In particular, the invention relates to an optical transmitter module constructed with coaxial type packaging.

2. Related Art

The optical communication industry has rapidly progressed to meet the demand of high-speed communication. A high-speed transmission system based on an optical-fiber requires a high-quality transceiver module. Techniques for optical transceiver module including high-speed devices technique, optical sub-modules technique, alignment technique and packaging technique. In the present state of the art, an optical sub-module is conventionally constructed with so-called coaxial type packaging, e.g. TO-CAN (transistor outline can) packaging.

Recently, the signal-processing speed of the optical sub-module has become increasingly higher. Because electrical connection in the convention TO-CAN packaging devices is achieved by wire bonding. The signal transmission speed in the conventional coaxial type or TO-CAN packaging device is usually limited to 2.5 Gbps. When the signal transmitting speed is up to 10 Gbps or higher, the coaxial type packaging device cannot efficiently work due to parasitic inductance of wire bonding and capacitance of package in high-frequency operation. The higher the signal transmitting speed, the more serious is the degradation of the signal quality, due to parasitic inductance, and capacitance of package and poor heat dissipation. Therefore, the reduction of parasitic inductance, and capacitance of package and better heat dissipation are critical to the future of coaxial type packaging products.

U.S. patent application Ser. No. 2002/0141142 discloses a coaxial type packaging, e.g. TO-CAN packaging device, that reduces the parasitic effects by adding a capacitor. However, the device is still need wire bonding, which also has the same prior problem in high speed signal transmission up to 10 Gpbs.

EP Patent No. 1267459 teaches mounting a light-emitting device on a large heat sink. The direct contact of the device with the heat sink increases the heat dissipation. Furthermore, conductive traces are formed on the heat sink to increase high-frequency features. However, forming traces on an edge of the heat sink is very difficult, and the electrical connection of the light-emitting device is still achieved by wire bonding, which adversely affects the yield and high-speed signal transmission.

SUMMARY OF THE INVENTION

Objects of the invention is to overcome the disadvantages of the prior art and provide an optical transmitter module having a plurality of devices mounted on a substrate with coaxial type packaging, e.g. TO-CAN packaging, which can be operated in high speed signal transmission up to 10 Gbps. To reduce signal transmitting path and parasitic inductance and capacitance of package in high frequency operation, a light-emitting device (such as laser, LED and so on) is bonded to the substrate by flip die method. And the heat produced by the device can be effectively dissipated through the substrate to outside. Signal transmission performance thereby is increased in high-frequency operation.

The optical transmitter module with coaxial type or TO-CAN packaging is used to convert an electric signal to an optical signal and then transmit the optical signal. The optical transmitter module includes a light-emitting device, a substrate, a base that has a plurality of pins and a cap. The light-emitting device is electrically connected via the substrate to the pins of the base. The cap is mounted on the base over the substrate to protect the light-emitting device. The cap includes a transparent region where light emitted from the light-emitting device can transmit through. Other devices such as optical detection devices or passive components are mounted on the substrate also and can be connected electrically to conductive traces on the substrate to reduce wire bonding.

The substrate has conductive traces through which the light-emitting device is electrically connected to other devices on the substrate. Furthermore, the conductive traces of the substrate are configured with adequate impedance to reduce parasitic impedance. The light-emitting device which having coplanar anode and cathode electrodes is electrically connected to the substrate by flip die method to reduce parasitic effects induced by wire bonding. An active region of the light-emitting device is proximity to the substrate so that heat generated by the active region can be dissipated through the substrate efficiently, to increase the performance of the signal transmission of the module at high temperature.

BRIEF DESCRIPTION OF THE DRAWINGS

The present invention will become more fully understood from the detailed description given herein below illustration, and thus are not limitative of the present invention, and wherein.

DETAILED DESCRIPTION OF THE INVENTION

In the invention, all optical devices are integrally mounted on a substrate to overcome disadvantages of the prior art described above and improving heat dissipation at the same time. A laser diode, having coplanar anode and cathode electrodes, is used as a light-emitting device in the invention. The light-emitting device is bonded to the substrate by flip die method and is electrically connected through the substrate via conductive traces. Thereby, the limitation of parasitic inductance of wire bonding can be reduced and then signal transmission can be protected and high-speed performance of the optical transmitter module can be increased.

Figure 1:
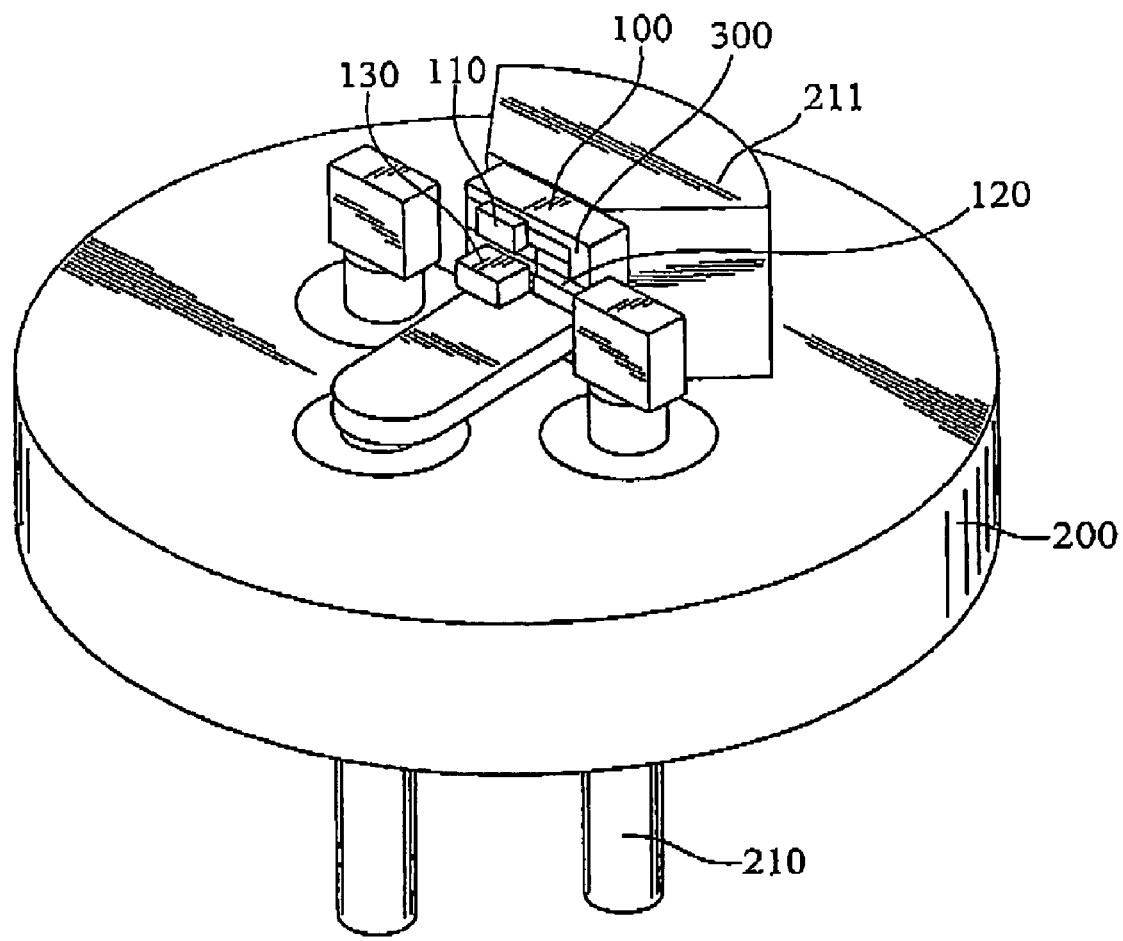
FIG. 1 is a schematic view of an optical transmitter module according to a first embodiment of the invention.

FIG. 1 is a schematic view of an optical transmitter module according to one embodiment of the invention. A laser diode 110, having coplanar anode and cathode electrodes, is bonded on a substrate 100 and is electrically connected to conductive traces 120. A monitor diode 130 is mounted on the same surface of the substrate 100 and electrically connected to the conductive traces 120. The electrical connection between the monitor diode 130 and the conductive traces 120 can be achieved by flip die method or wire bonding. The parasitic impedance of conductive traces 120 can be controlled easily to instead of parasitic impedance of wire bonding. A base 200 includes at least one stand 211 where the substrate 100 can be bonded on. The base 200 further has a plurality of pins 210. The laser diode 110 electrically connects to the pins 210 via the substrate 100 so that high-frequency driving signals can be transmitted to the laser diode 110 from the outside. The contact area between the substrate 100 and the stands 211 is large enough to conduct heat from the substrate to the outside of the optical transmitter module. Since all the devices are mounted on the same substrate, all the signals can be transmitted via the conductive traces of the substrate without additional wires, and then signal loss caused by parasitic impedance can be reduced when high-frequency signal transmission is implemented.

Furthermore, the laser diode 110, having coplanar anode and cathode electrodes, is used as the light-emitting device and mounted on the substrate by flip die method. Because a light-emitting region of the light-emitting device generating a substantial amount of heat in operation is proximity to the substrate, the heat can dissipate away from the device by heat conduction to the substrate efficiently. Therefore, the device is not damaged as a result of poor heat dissipation, and the light-emitting efficiency of the module is not reduced. In addition, a cap (not shown) which may be made of metal can be mounted on the base to complete the TO-CAN packaging. The cap includes a transparent region through which light generated from the laser diode can penetrate. The transparent region is made of a transparent material or can be a lens.

Alignment keys can be further formed on the substrate for precise alignment of the laser diode. The cap and the base can be also precisely aligned relative to each other by means of these alignment keys. Thereby, the assembly time of the optical transmitter module can be reduced with increased yield.

In order to reduce cross-talk effects, an equipotential plane 300 can be further formed on the substrate. The laser diode 110 and the monitor diode 130 can electrically connect to the equipotential plane 300 and then connect to the base via a ground hole of the substrate 100. Then the metal cap is mounted on the base to protect the devices mounted on the substrate 100 and implements a well shielding to prevent the cross-talk effects or electromagnetic influence.

Figure 2:
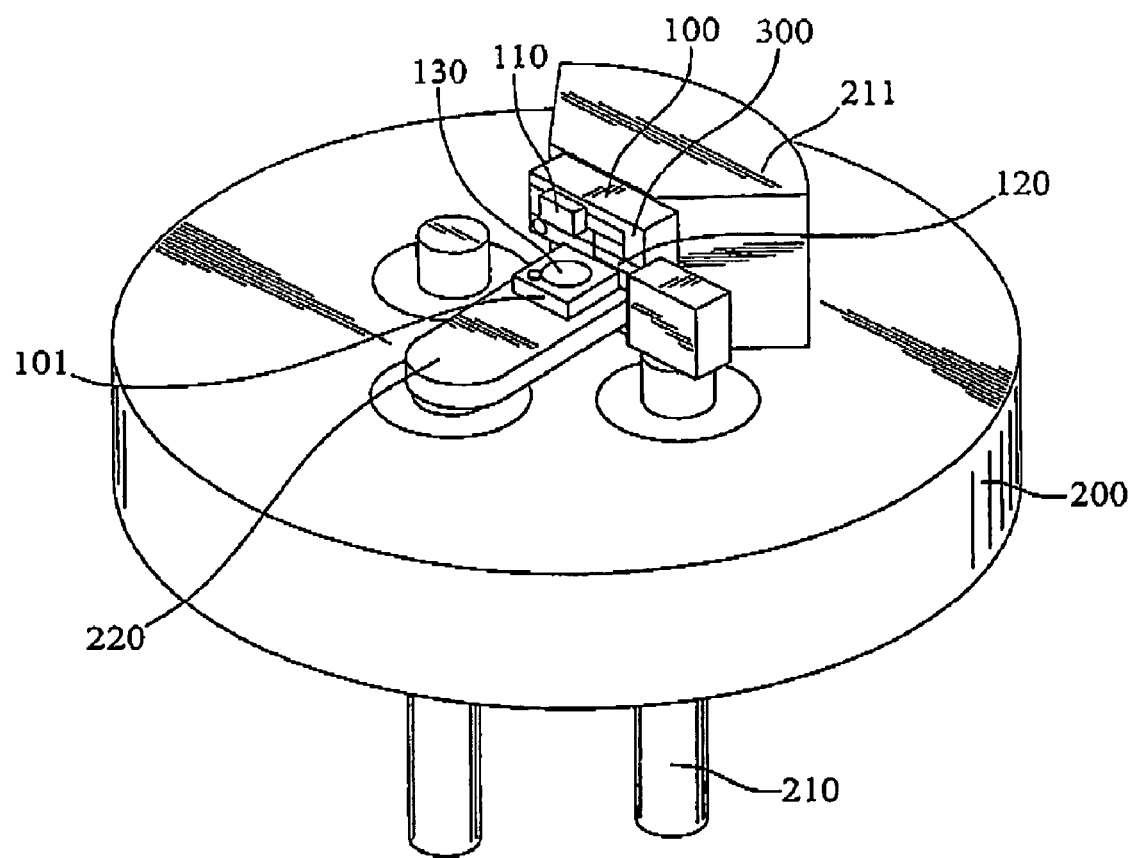
FIG. 2 is a schematic view of an optical transmitter module according to a second embodiment of the invention.

In another embodiment of the invention, optical detection devices can be formed on another substrate coupled with the base or mounted directly on a carrier 220 connected to one of pins 210 electrically. Referring to FIG. 2, the laser diode 110 is mounted on a first substrate 100 by flip die method and electrically connected to the conductive traces 120. The first substrate 100 is mounted to the stand 211 of the base 200. The monitor diode 130 is mounted on a second substrate 101 and electrically connects to the first substrate 100 by flip die method or wire bonding. The second substrate 101 is mounted on the carrier 220 placed on the base 200 and electrically connects to the pins 210 of the base 200. Thereby, high-frequency electric signals can be transmitted to the laser diode 110 from the outside of the module. Although the devices are separately formed on the first and second substrates 100, 101, parasitic impedance can still be reduced when a high-frequency signal is transmitted because least wire bonding used.

Knowing the invention thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical transmitter module with a coaxial type packaging, used to convert an electric signal to an optical signal and then transmit the optical signal, the optical transmitter module comprising:
    a base, having a plurality of pins;
    a substrate, the substrate having a plurality of electric traces on surfaces thereof;
    a light-emitting device having coplanar anode and cathode electrodes, the electrodes being electrically connected to the electric traces on the substrate by electrically flip-die bonded to the substrate, wherein the light-emitting device is electrically connected through the substrate to the pins of the base; and
    a cap, mounted on the base over the substrate to protect the light-emitting device,
    wherein the optical signal is transmitted by the optical transmitter module with a speed up to 10 Gbps and heat produced by the optical transmitter module is dissipated through the substrate.

2. The optical transmitter module of claim 1, wherein the light-emitting device is a laser diode having coplanar anode and cathode electrodes.

3. The optical transmitter module of claim 1, wherein the coaxial type packaging is a TO-CAN type packaging.

4. The optical transmitter module of claim 1, wherein the substrate includes an equipotential plane, and the equipotential plane electrically connects to the base.

5. The optical transmitter module of claim 1, further comprising an optoelectric device mounted on the substrate.

6. The optical transmitter module of claim 5, wherein the optoelectric device is a monitor diode.

7. An optical transmitter module with a coaxial type packaging, used to covert an electric signal to an optical signal and then transmit the optical signal, the optical transmitter module comprising:
    a base, having a plurality of pins;
    a substrate, wherein the substrate has a plurality of conductive traces;
    an optoelectric device is mounted on the substrate, wherein the optoelectric device is electrically connected to the traces;
    a light-emitting device having coplanar anode and cathode electrodes and electrically flip-die bonded to the substrate,
    wherein the light-emitting device is electrically connected through the substrate to the pins of the base; and
    a cap, mounted on the base over the substrate to protect the light-emitting device,
    wherein the optical signal is transmitted by the optical transmitter module with a speed up to 10 Gbps and heat produced by the optical module is dissipated through the substrate.

8. The optical transmitter module of claim 5, wherein substrate includes an equipotential plane and the equipotential plane electrically connect to the base.

9. The optical transmitter module of claim 1,
    a second substrate to carry an optoelectric device.

10. The optical transmitter module of claim 9, wherein the optoelectric device is a monitor diode.

11. An optical transmitter module with a coaxial type packaging, used to covert an electric signal to an optical signal and then transmit the optical signal, the optical transmitter module comprising:
    a base, having a plurality of pins;
    a substrate;
    a light-emitting device having coplanar anode and cathode electrodes and electrically flip-die bonded to the substrate, wherein the light-emitting device is electrically connected through the substrate to the pins of the base; and
    a cap, mounted on the base over the substrate to protect the light-emitting device, wherein the optical signal is transmitted by the optical transmitter module with a speed up to 10 Gbps and heat produced by the optical module is dissipated through the substrate;

wherein the base further comprises a stand where the substrate is mounted on.

12. The optical transmitter module of claim 1, wherein the cap includes a transparent region where light emitted from the light-emitting device transmits.

13. The optical transmitter module of claim 12, wherein the transparent region is a lens.

14. The optical transmitter module of claim 12, wherein the transparent region is formed of a transparent material.

15. The optical transmitter module of claim 3, wherein the base further comprises a stand where the substrate is mounted on.

16. The optical transmitter module of claim 9, wherein the base further comprises a stand where the substrate is mounted on.

* * * * *